United States Patent [19]

Shookhtim et al.

[11] Patent Number: 4,984,203

[45] Date of Patent: Jan. 8, 1991

[54] HIGH SPEED STATIC BICMOS MEMORY WITH DUAL READ PORTS

[75] Inventors: Rimon Shookhtim, La Jolla; Lo-Shan Lee, San Diego; Babak Mansoorian, La Jolla, all of Calif.

[73] Assignee: Unisys Corporation, Blue Bell, Pa.

[21] Appl. No.: 453,567

[22] Filed: Dec. 20, 1989

[51] Int. Cl.$^5$ ............................................. G11C 13/00
[52] U.S. Cl. ..................................... 365/177; 365/203
[58] Field of Search ............... 365/177, 182, 202, 203, 365/190, 205

[56] References Cited

U.S. PATENT DOCUMENTS 4,858,183  8/1989  Scharrer ............................. 365/177

Primary Examiner—Terrell W. Fears
Attorney, Agent, or Firm—Charles J. Fassbender; Mark T. Starr

[57] ABSTRACT

A memory includes a plurality of cells with each cell containing a pair of cross-coupled N-channel field-effect transistors having set a reset nodes. Also in each cell, a first P-channel transistor couples a first select line to the set node; a first bipolar transistor couples the set node to a first bit line; a second P-channel trnasistor couples a second select line to the reset node; and a second bipolar transistor couples the reset node to a second bit line. Data is read from one port of the cell by pulling up just the set node via the first selected line and first P-channel transistor; and data is read from another port of the cell by pulling up just the reset node via the second select line and second P-channel transistor. Both such reads are fast since the parasitic capacitance of each select line is dependent on just a single pull-up transistor per cell. Also the cell is small in size since it is made with two less transistors than a conventional cell.

14 Claims, 5 Drawing Sheets

HIGH SPEED STATIC BICMOS MEMORY WITH DUAL READ PORTS

BACKGROUND OF THE INVENTION

This invention relates to the structure and operation of semiconductor memories; and more particularly, it relates to static BiCMOS memories having dual read ports.

In a static memory, data is stored in each memory cell on a pair of transistors which are cross-coupled to each other. These cross-coupled transistors form a set node and a reset node of the cell. To store a digital 0 in the cell, one of the transistors is turned on while the other transistor is turned off; and to store a digital 1 in the cell, the on and off states of the transistors are reversed All of this is in comparison to a dynamic memory in which each cell consists of a single transistor and a capacitor; and data is stored in the cell by charging or discharging the capacitor.

In the prior art, static memory cells with dual read ports have been disclosed which are made of all field-effect transistors. See, for example, the article entitled "The Twin Port Memory Cell" by K. O'Connor, *IEEE Journal of Solid State Circuits*, Vol. SC-22 No. 5, October 1987. In that article, FIG. 2 shows two structures for an NMOS memory cell having dual read ports, and FIG. 4 shows one structure for a CMOS memory cell having dual read ports. However, a drawback of a memory cell that is made of all field-effect transistors is that the reading of data from the cell is inherently slow. This, in part, is due to the fact that during a read operation, the bit lines to which the cell connects must be charged or discharged; and field-effect transistors provide no current gain for speeding up this charging operation.

By comparison, with a BiCMOS static memory cell, this problem is overcome. Such a cell is described in the prior art in a paper entitled "On the Analysis and Design of a CMOS-Bipolar SRAMs" by De Los Santos et al in the *IEEE Journal of Solid State Circuits*, Vol. SC-22 No. 4, August 1987. There, the set and reset nodes of the memory cells are coupled to the bit lines through respective bipolar transistors, and each bipolar transistor provides a current gain. Typically, this current gain is in the range of fifty to one hundred; and, the bit lines charge with a speed that is proportional to the magnitude of that current gain.

However, BiCMOS memory cells of the prior art are deficient in that they do not have dual read ports. Also, in attempting to add a second read port to a single port BiCMOS cell, care must be taken to not add too many extra components; otherwise the cell will be too big for use in large memory cell arrays Further, since computer systems which read memory cells tend to get faster and faster, any modification to a memory which increases the cell's read speed beyond conventional BiCMOS would be a major improvement.

Accordingly, a primary object of the invention is to provide an improved BiCMOS memory cell in which the above problems are overcome.

BRIEF SUMMARY OF THE INVENTION

A memory includes a plurality of cells with each cell containing a pair of cross-coupled N-channel field-effect transistors having set and reset nodes. Also in each cell, a first P-channel transistor couples a first select line to the set node; a first bipolar transistor couples the set node to a first bit line; a second P-channel transistor couples a second select line to the reset node; and a second bipolar transistor couples the reset node to a second bit line. Data is read from one port of the cell by pulling up just the set node via the first select line and first P-channel transistor; and data is read from another port of the cell by pulling up just the reset node via the second select line and second P-channel transistor. Both such reads are fast since the parasitic capacitance of each select line is dependent on just a single pull-up transistor per cell. Also, the cell is small in size since it is made with two less transistors than a conventional cell.

BRIEF DESCRIPTION OF THE DRAWINGS

Various features and advantages of the invention are described herein in conjunction with the accompanying drawings wherein.

DETAILED DESCRIPTION OF THE INVENTION

Figure 1:
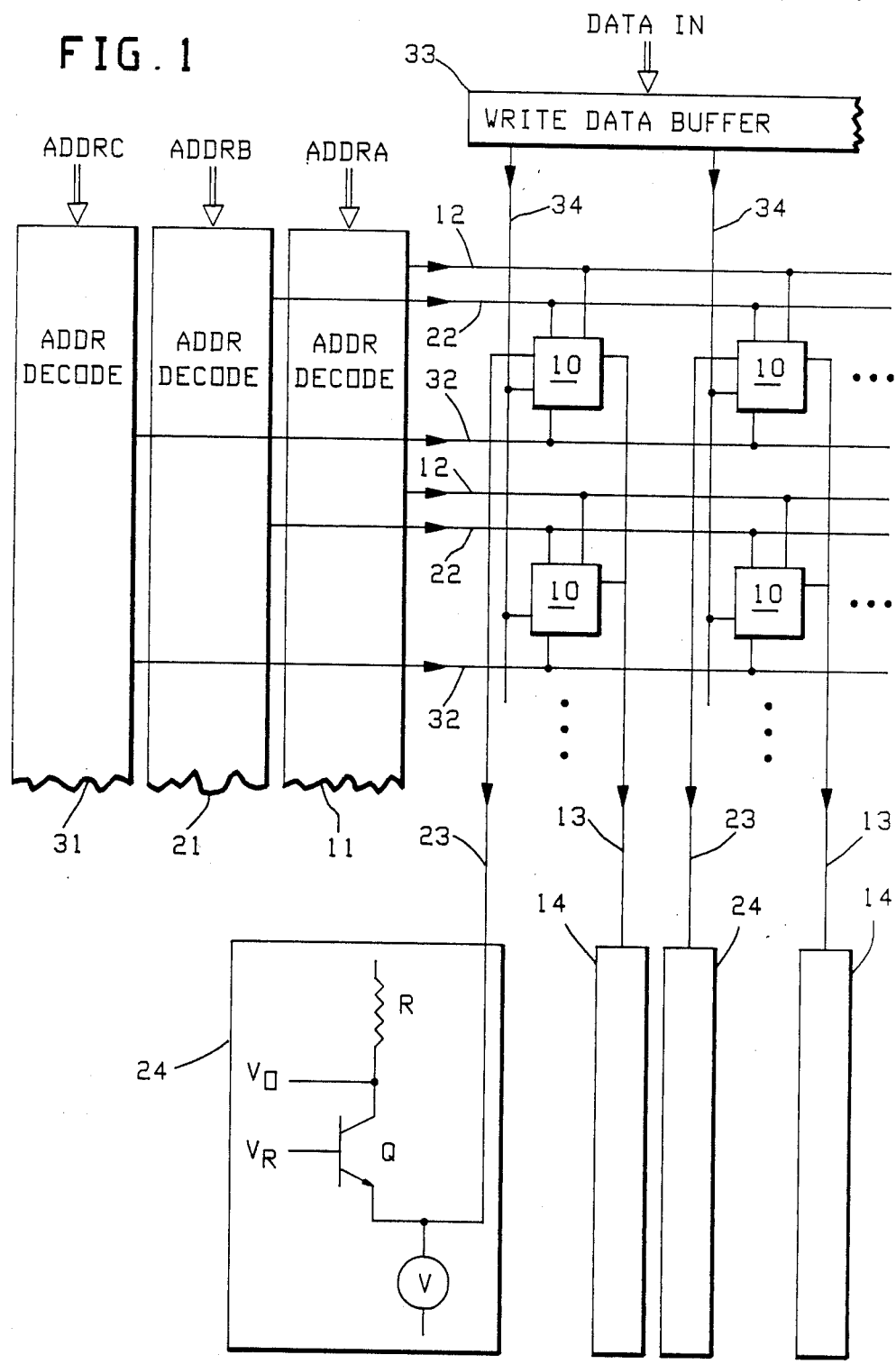
FIG. 1 shows an overview of a multiport memory which is constructed according to the invention.

Referring now to FIG. 1, a preferred embodiment of a memory which is constructed with two read ports and one write port according to the invention will be described in detail. This memory includes a plurality of memory cells 10 which are arranged in an array of rows and columns. In the array there can be any number of cells per row and any number of cells per column.

One of the read ports of the FIG. 1 memory is comprised of an address decoder 11, a first set of select lines 12, a first set of bit lines 13, and a first set of sense amplifiers 14. All of these components are interconnected to the memory cells 10 as illustrated. In operation, the decoder 11 receives an "A" address as an input, and in response it selects one row of memory cells by generating a high voltage signal on the select line 12 of that row. Low voltage signals which deselect the cells are generated by decoder 11 on the remaining select lines 12. Each cell which receives a high voltage on its select line 12 responds by sending the data bit which it stores onto a bit line 13 whereupon the data is sensed by the sense amplifiers 14.

Another read port of the FIG. 1 memory is comprised of a second address decoder 21, a second set of select lines 22, a second set of bit lines 23, and a second set of sense amplifiers 24. All of these components are interconnected to the memory cells 10 as illustrated. In operation, decoder 21 receives a "B" address as an input, and in response it selects a row of cells by generating a high voltage signal on the corresponding select line 22. Those memory cells which receive a high voltage on their select line 22 respond by sending the data bit which they store to the bit lines 23 whereupon that data is sensed by the sense amplifiers 24.

A write port of the FIG. 1 memory is comprised of a write address decoder 31, a third set of select lines 32, a write data buffer 33, and a third set of bit lines 34. All of these components are interconnected to the memory cells 10 as illustrated. In operation, data that is to be written into the memory is sent through the data buffer 33 to the bit lines 34. At the same time, decoder 31 receives a "C" address as an input, and it decodes that address by generating a high voltage pulse on one of the select lines 32 while keeping the voltage on the remaining select lines 32 low. Those cells which receive the high voltage pulse on the select lines 32 respond by storing the data that is on the bit lines 34.

Figure 2:
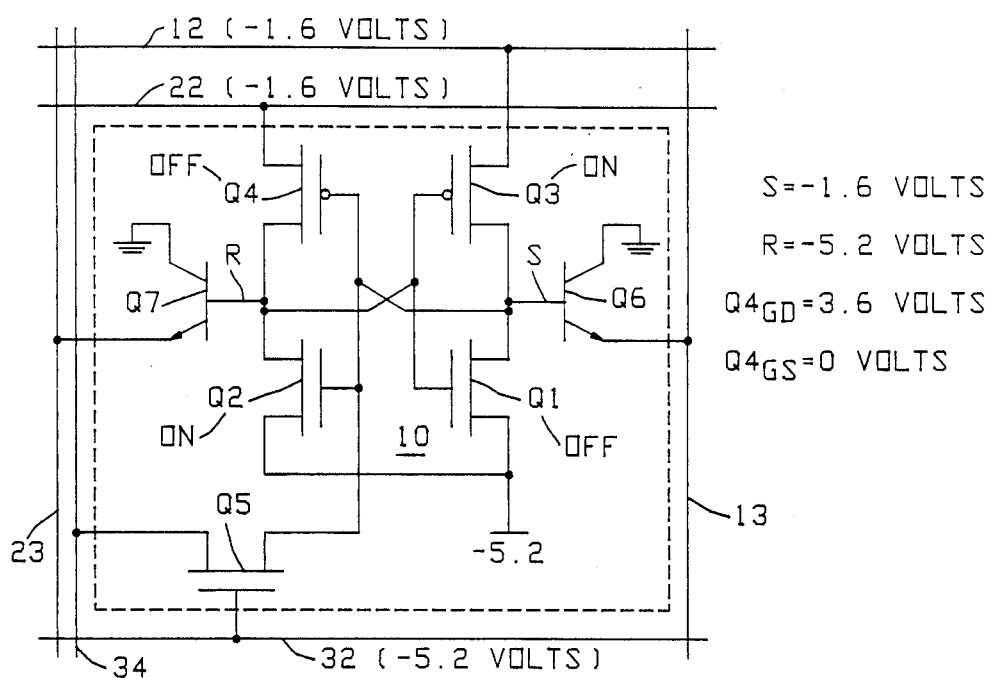
FIG. 2 shows all of the details of the structure of a memory cell in the FIG. 1 memory.
Figure 3:
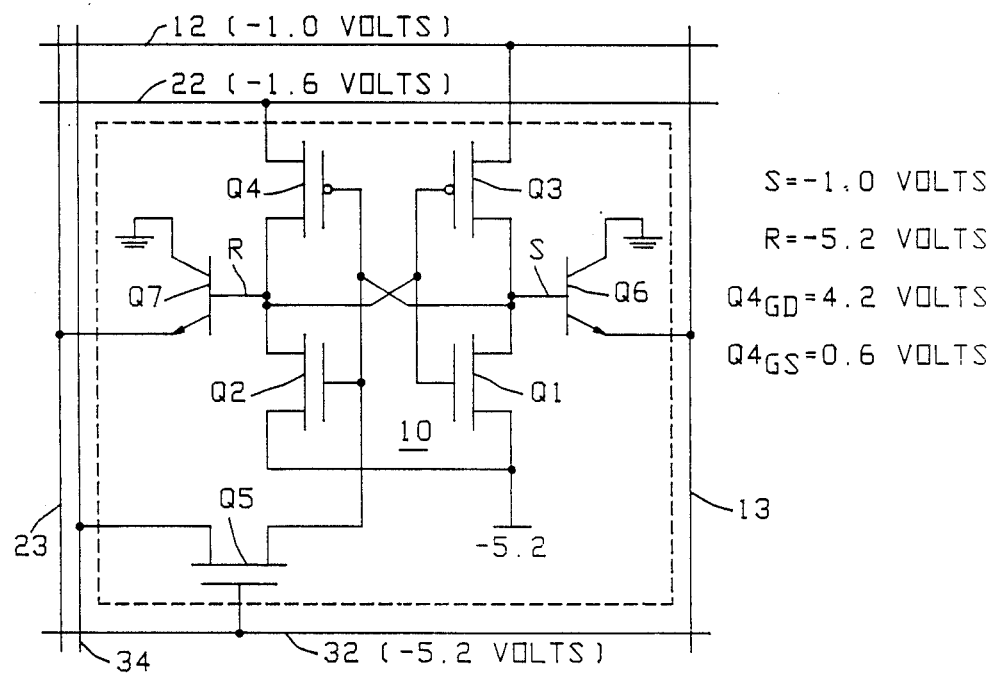
FIG. 3 shows various voltages which occur in the FIG. 2 memory cell as the cell is read from its first read port.
Figure 4:
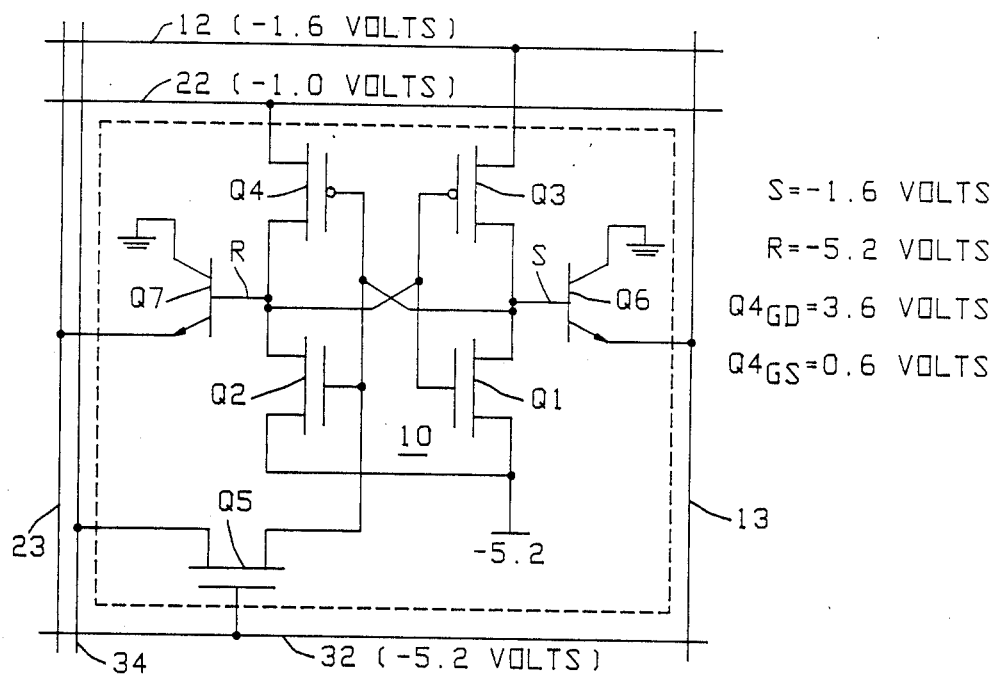
FIG. 4 shows various voltages which occur in the FIG. 2 memory cell as the cell is read from its second read port; and,.

A primary point of novelty in this memory is the structure and operation of each of the individual memory cells 10. That structure and operation, for a preferred embodiment of the memory cells, is illustrated in FIGS. 2, 3, and 4. Each of those memory cells consists of a total of seven transistors Q1–Q7, and they are interconnected as shown. With this embodiment, suitable high and low voltages for the select lines 12 and 22 are −1.0 volts and −1.6 volts; while suitable high and low voltages for the select lines 32 and bit lines 34 are 0 volts and −5.2 volts.

Transistors Q1 and Q2 are N-channel field-effect transistors which have a positive threshold voltage. These transistors Q1 and Q2 have their source and drain cross-coupled to form a set node S and a reset node R of the cell. Transistor Q3 is a P-channel field-effect transistor which has a negative threshold voltage and transistor Q6 is an NPN bipolar transistor. Transistor Q3 operates as a pull-up device in that it responds to a high voltage on the select line 12 to pull up the set node voltage, and that causes transistor Q6 to read data from the cell onto bit line 13. Similarly, transistor Q4 is a P-channel field-effect transistor which has a negative threshold voltage and transistor Q7 is an NPN bipolar transistor. Transistor Q4 operates as a pull-up device in that it responds to a high voltage on select line 22 to pull up the reset node voltage, and that causes transistor Q7 to read data from the cell onto the bit line 23.

Transistor Q5 is an N-channel field-effect transistor which has a positive threshold voltage, and it operates in response to a high voltage pulse on select line 32 to force the cell to enter either a set state or a reset state. In a set state, transistors Q2 and Q3 are on while transistors Q1 and Q4 are off. This state is entered if the voltage on bit line 34 is high when the high voltage pulse on select line 32 occurs. Conversely, in a reset state, transistors Q1 and Q4 are on while transistors Q2 and Q3 are off. This state is entered if the voltage on bit line 34 is low when the high voltage pulse on select line 32 occurs.

Assume now that the memory cell is in a set state and that the voltages on all of the cell's select lines 12, 22, and 32 are low. This state of operation is illustrated in FIG. 2. In that state, the voltage on the set node S is the same as the voltage on the select line 12 because transistor Q3 is on; and the voltage on the reset node R is the same as the cell's bias voltage of −5.2 volts since transistor Q2 is on.

From the above, it follows that the gate voltage of transistor Q4 with respect to its drain is +3.6 volts. Also, the gate voltage of transistor Q4 with respect to its source is 0 volts. Both of these voltages keep transistor Q4 turned off because transistor Q4 has a negative threshold voltage. Since transistor Q4 stays turned off, the voltage on the reset node R remains stable at −5.2 voltage; transistor Q1 remains off; and the voltage on the set node S remains stable at −1.6 volts.

Suppose now that the voltage on select line 12 is raised to −1.0 volts in order to read the data from the cell on to bit line 13. This rise in the select line voltage is illustrated in FIG. 3. As the voltage on select line 12 increases, a corresponding increase occurs on set node S since transistor Q3 is on. That increase in the set node voltage raises the set node voltage above the reference voltage $V_R$ in the FIG. 1 sense amplifier 24; and thus transistor Q6 becomes conductive while the sense amplifier transistor Q becomes nonconductive. In turn, the output signal $V_O$ of the sense amplifier goes to a high voltage.

When the voltage on the set node S increases to −1.0 volts, the voltage on the gate of transistor Q4 also increases to that same voltage. This changes the gate voltage of transistor Q4 with respect to its drain to +4.2 volts, and it changes the gate voltage of transistor Q4 with respect to its source to +0.6 volts. Both of these voltages for transistor Q4 are more positive than they are in FIG. 2. Thus, transistor Q4 remains turned off; and consequently, all of the operating voltages in the cell remain stable.

Next, consider the operation of the memory cell when it is read onto bit line 23. Such a read is achieved by raising the voltage on select line 22 to −1.0 volts as is illustrated in FIG. 4. Since transistor Q4 is off, the voltage increase on select line 22 does not change the voltage of the reset node R. Thus, the reset node R remains at −5.2 volts which is lower than the reference voltage $V_R$ in the sense amplifier. Consequently, current flows through the sense amplifier transistor Q which generates a low output signal $V_O$.

At the same time, however, raising the voltage on select line 22 can affect whether or not transistor Q4 remains turned off. This is because when the voltage on select line 22 is raised from −1.6 volts to −1.0 volts, the voltage on the source of transistor Q4 is raised by a like amount but the voltage on the gate of transistor Q4 remains at −1.6 volts. Thus the gate voltage of transistor Q4 with respect to its source changes from 0 volts to −0.6 volts. So, in order to keep transistor Q4 turned completely off during a read operation, that transistor preferably has a negative threshold whose magnitude exceeds the voltage swing on select line 22.

By symmetry, it can be seen that the above preferred constraint on the threshold voltage for transistor Q4 also applies to the threshold voltage of transistor Q3. Keeping transistor Q3 turned off becomes an important consideration when the cell is in a reset state, and the voltage on select line 12 is raised from −1.6 volts to −1.0 volts. To keep transistor Q3 turned off under those conditions, it should have a negative threshold voltage whose magnitude exceeds the magnitude of the voltage swing on select line 12.

A primary feature of the above-described memory cell is that data can be read from the cell quicker than it can be read from the cells of the prior art. This improvement in read speed is due to the fact that each of the select lines 12 and 22 has a minimal amount of parasitic capacitance associated with them since they only couple to a single transistor in each of the memory cells. By comparison, the select lines in prior art BiCMOS memories, such as those described in the Background reference, connect to two transistors in each memory cell.

As a numerical example of the significance of this point, consider the following calculation. Assume that in the memory of FIG. 1: (a) each select line connects to one hundred twenty-eight memory cells; (b) the drain capacitance of each of the pull-up transistors Q3 and Q4 is twelve femtofarads; and (c) that the intrinsic capacitance of each select line is one picofarad. Then, having one pull-up transistor per cell results in a select line capacitance C1 of $128[12(10\ \text{EXP-}15)] + 10(\text{EXP-}12)$ or 2.5 picofarads; whereas having two pull-up transistors per cell results in a select line capacitance C2 of $2(128)[12(10\ \text{EXP-}15)] + 10(\text{EXP-}12)$ or 4 picofarads. Rise time and fall time of a voltage signal on a select line is inversely proportional to the select line's total capacitance, and thus the quantity of $(C2-C1)/C1$ or 60% gives the improvement in memory cell select speed.

Another primary feature of the above described memory is that it has two read ports and one write port at a cost of just seven transistors per cell. By comparison, in the BiCMOS memory of the cited Background reference by De Los Santos, there is one less read port; there are six transistors per cell; and there is no teaching or suggestion in the reference on how another read port could be added. If the dual read port structure of the Background reference by O'Connor is used with the De Los Santos cell, then one more bipolar transistor and two more field-effect transistors (the bit line access transistors) need to be added to the De Los Santos cell; and that would result in a total of nine transistors per cell.

A preferred embodiment of a memory which is constructed according to the invention has now been described in detail. In addition, however, many changes and modifications can be made to this preferred embodiment without departing from the nature and spirit of the invention. Some examples of these modifications, each of which has at least one of the above features, are shown in FIGS. 5-9.

Figure 5:
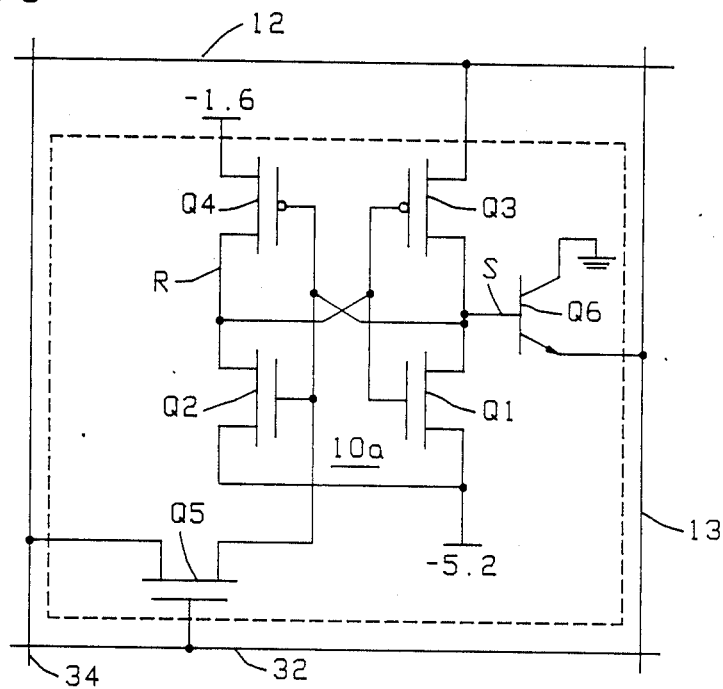
FIGS. 5, 6, 7, 8 and 9 show respective modifications to the FIG. 2 memory cell.

In the modification of FIG. 5, each cell has a structure which is indicated by reference numeral 10a. That cell structure 10a is the same as the structure of cell 10 with the following exceptions: (1) transistor Q7 is eliminated; (2) all of the select lines 22 are eliminated; (3) all of the bit lines 23 are eliminated; (4) and, the source of transistor Q4 is connected to a fixed bias of −1.6 volts Due to these modifications, the FIG. 5 memory cell has just one read port and one write port, and the total number of transistors in the FIG. 5 memory cell is reduced to six. Data is read from the FIG. 5 memory cell with the same speed at which data is read from the previously described cell 10, since both cells have the same read port from their set node.

Figure 6:
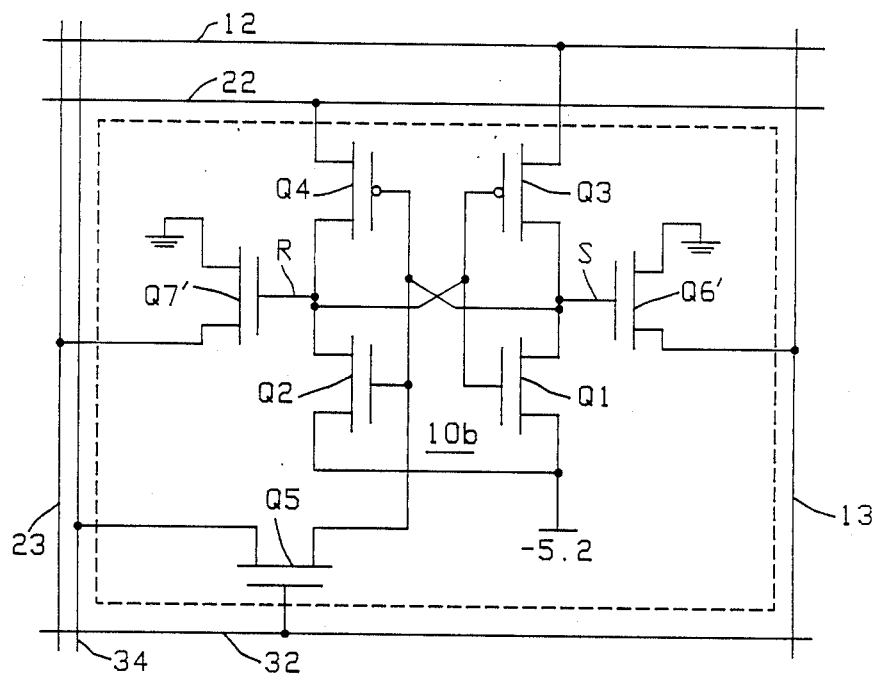

In the modification of FIG. 6, each cell has a structure which is indicated by reference numeral 10b. With this modification, the only change that is made to the previously described memory cell 10 is that the bipolar transistors Q6 and Q7 are replaced with N-channel field-effect transistors Q6' and Q7'. Such a modification reduces the physical size of the cell since field-effect transistors can be made smaller than bipolar transistors. However, this advantage of reduced cell size is offset by a loss of current gain and accompanying read speed which the bipolar transistors Q6 and Q7 provide.

Figure 7:
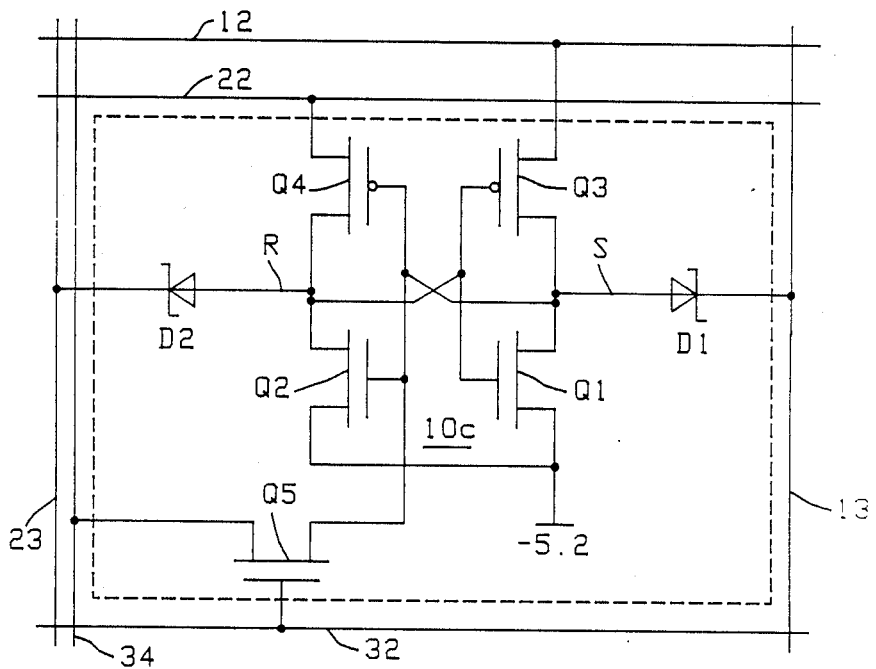

In the modification of FIG. 7, each cell has a structure which is indicated by reference numeral 10c. That structure is the same as the structure of the previously described cell 10 with the exception that the bipolar transistors Q6 and Q7 are replaced with Schottky diodes D1 and D2. Such diodes can be of the Schottky type or PN junction type, and they further reduce the cell's size since they can be made even smaller than the field-effect transistors Q6' and Q7'. This size advantage is, however, again offset by the loss of current gain and accompanying read speed which bipolar transistors Q6 and Q7 provide.

Figure 8:
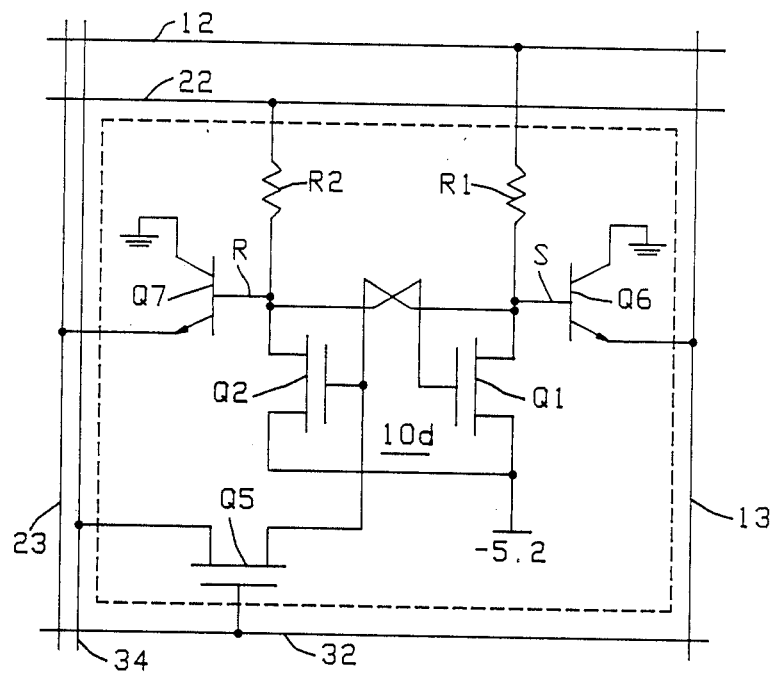

In the "modification of FIG. 8, each cell has a structure which is indicated by reference numeral 10d. There, all of the components are the same as they are in the previously described cell 10 with the exception that the pull-up transistors Q3 and Q4 are replaced with pull-up resistors R1 and R2. With this modification, resistor R1 pulls up the set node voltage when the cell is read by a high voltage signal on select line 12; and resistor R2 pulls up the reset node voltage when the cell is read by a high voltage signal on select line 22.

However, in comparison to the preceding embodiments, current passes through resistor R1 when transistor Q1 is on, and that in turn raises the voltage on the set node S above −5.2 volts. Similarly, current passes through resistor R2 when transistor Q2 is on, and that raises the voltage on the reset node R above −5.2 volts. This voltage increase on the set and reset nodes is inversely proportional to the magnitude of the resistors R1 and R2; and, if the voltage on a set or reset node gets too high, the transistor whose gate connects to that node will tend to turn on. Consequently, a constraint on this embodiment is that the resistors R1 and R2 be large enough to keep only one of the transistors Q1 and Q2 on at a time.

Figure 9:
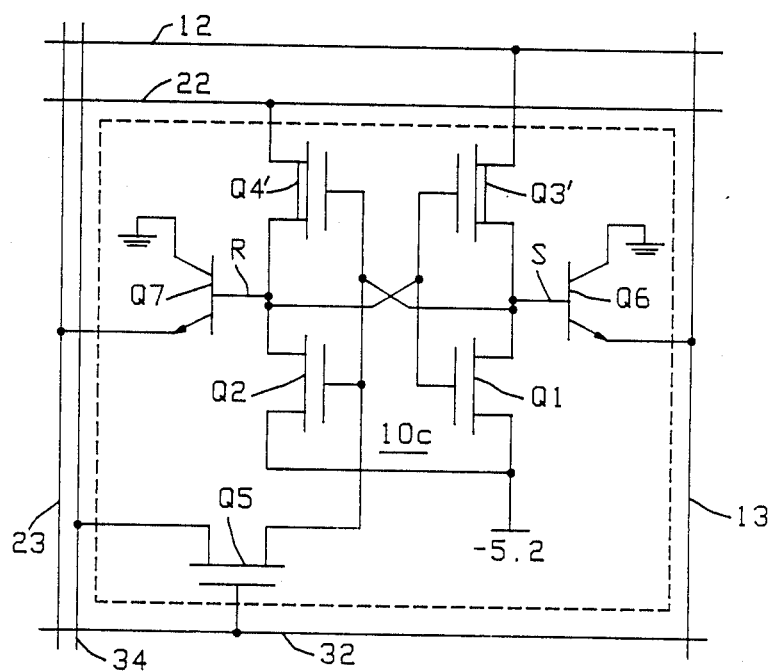

In the modification of FIG. 9, each cell has a structure which is indicated by reference numeral 10e. That structure is the same as the structure of the previously described cell 10 with the exception that the P-channel transistors Q3 and Q4 are replaced with depletion mode N-channel transistors Q3' and Q4'. In operation, the transistors Q3' and Q4' provide respective resistances between their source and drain, and thus they act like the pull-up resistors R1 and R2. These source-drain resistances which the depletion mode transistors provide are large enough to meet the above constraint, and the transistors in which they are embodied can be constructed in a relatively small amount of chip space in comparison to the space which other type resistances of similar magnitude require.

Accordingly, in view of the variety of forms in which the present invention may be embodied, it is to be understood that the invention is not to be limited except as defined by the appended claims.

WHAT IS CLAIMED IS:

1. A memory which includes a plurality of cells with each cell containing a pair of cross-coupled field-effect transistors having set and reset nodes, select lines in said memory for selecting certain cells to be read, and bit lines which receive data read from a selected cell; wherein: each cell has a first read port which includes a first pull-up means that is coupled from a first select line to said set node plus a first bipolar transistor that is coupled from said set node to a first bit line; and, each cell has a second read port which includes a second pull-up means that is coupled from a second select line to said reset node plus a second bipolar transistor that is coupled from said reset node to a second bit line.

2. A memory according to claim 1 wherein each of said cross-coupled transistors is an N-channel transistor and each of said pull-up means is a P-channel transistor.

3. A memory according to claim 2 wherein said select lines carry high and low voltages which respectively select and deselect a cell, and each of said P-channel transistors has a negative threshold voltage whose magnitude exceeds the difference between said high and low voltages.

4. An improved memory of the type which includes a plurality of cells with each cell containing a pair of cross-coupled transistors having set and reset nodes, select lines in said memory for carrying voltages that select certain cells to be read, and bit lines for receiving data that is read from a selected cell; wherein to enable each of said cells to be selected from two separate ports, the improvement comprises:

a first pull-up means, in each of said cells, which couples said voltages from one of said select lines to the cell's set node; and, a second pull-up means, in each of said cells, which couples said voltages from a different select line to the cell's reset node.

5. A memory according to claim 4 wherein said voltages on said select lines have high and low levels and each of said pull-up means has a threshold voltage which exceeds the difference between said voltage levels.

6. A memory according to claim 4 wherein said cross-coupled transistors are N-channel transistors and each of said pull-up means is a P-channel transistor.

7. A memory according to claim 4 wherein said cross-coupled transistors are N-channel transistors and each of said pull-up means is a depletion mode transistor.

8. A memory according to claim 4 wherein said cross-coupled transistors are N-channel transistors and each of said pull-up means is a resistor.

9. A memory according to claim 4 wherein said set and reset nodes in each of said cells are coupled to said bit lines through the base-emitter terminals of respective bipolar transistors which have a fixed collector voltage.

10. A memory according to claim 4 wherein said set and reset nodes in each of said cells are coupled to said bit lines through the gate-drain terminals of respective field effect transistors which have a fixed source voltage.

11. A memory according to claim 4 wherein said set and reset nodes in each of said cells are coupled through respective diodes to said bit lines.

12. An improved memory of the type which includes a plurality of cells with each cell containing a pair of cross-coupled transistors having set and reset nodes, select lines in said memory for selecting certain cells to be read, and bit lines which receive data read from a selected cell; wherein each of said cells further includes a first pull-up means which couples one of the cell's nodes to a first select line and, a second pull-up means which couples the cell's other node to a voltage-carrying conductor other than said first select line.

13. A memory according to claim 12 wherein said second pull-up means in each cell couples the cell's other node to a second select line.

14. A memory according to claim 12 wherein said second pull-up means in each cell couples the cell's other node to a conductor carrying a fixed voltage.

* * * * *